(12) United States Patent
Asam et al.

(10) Patent No.: US 6,853,836 B2
(45) Date of Patent: Feb. 8, 2005

(54) POLAR LOOP TRANSMISSION CIRCUIT

(75) Inventors: Michael Asam, Wollomoos (DE);
Stefan Herzinger, München (DE);
Gunther Kraut, Unterhaching (DE);
Martin Simon, Otterfing (DE); Xiaopin Zhang, München (DE)

(73) Assignee: Infineon Technologies AG, Munich (DE)

( * ) Notice: Subject to any disclaimer, the term of this patent is extended or adjusted under 35 U.S.C. 154(b) by 617 days.

(21) Appl. No.: 10/000,694

(22) Filed: Nov. 15, 2001

(65) Prior Publication Data

US 2002/0080716 A1 Jun. 27, 2002

(30) Foreign Application Priority Data

Nov. 15, 2000 (DE) .......................................... 100 56 472

(51) Int. Cl.[7] .............................. H04L 5/04; H01Q 11/12
(52) U.S. Cl. ........................ 455/126; 370/205; 370/347; 455/108
(58) Field of Search .......................... 455/91, 102, 108, 455/118, 126, 127.1, 110; 370/205, 263, 345, 347, 344; 332/149, 151, 159, 162

(56) References Cited

U.S. PATENT DOCUMENTS

| | | | |
|---|---|---|---|
| 4,481,672 A | | 11/1984 | Watkinson |
| 4,933,986 A | * | 6/1990 | Leitch .......................... 455/119 |
| 5,222,250 A | * | 6/1993 | Cleveland et al. ............. 455/47 |
| 5,226,167 A | * | 7/1993 | Yamaguchi ................... 332/107 |
| 5,430,416 A | | 7/1995 | Black et al. |
| 5,732,333 A | * | 3/1998 | Cox et al. ..................... 455/126 |
| 5,920,556 A | * | 7/1999 | Jorgensen .................... 370/350 |
| 6,002,923 A | * | 12/1999 | Sahlman ...................... 455/118 |
| 6,047,168 A | * | 4/2000 | Carlsson et al. ............. 455/126 |
| 6,101,224 A | * | 8/2000 | Lindoff et al. ............... 375/300 |
| 6,194,963 B1 | * | 2/2001 | Camp et al. .................. 330/149 |
| 6,215,986 B1 | * | 4/2001 | Green ........................... 455/126 |
| 6,240,278 B1 | * | 5/2001 | Midya et al. ................ 455/126 |
| 6,377,784 B2 | * | 4/2002 | McCune ....................... 455/108 |
| 6,477,371 B1 | * | 11/2002 | Hofmann ..................... 455/434 |
| 6,590,940 B1 | * | 7/2003 | Camp et al. .................. 375/297 |
| 6,631,254 B1 | * | 10/2003 | Wilson et al. ................. 455/91 |
| 6,708,044 B1 | * | 3/2004 | Puknat et al. ............. 455/552.1 |
| 6,792,282 B1 | * | 9/2004 | Domino et al. .............. 455/522 |

FOREIGN PATENT DOCUMENTS

| | | |
|---|---|---|
| DE | 44 80 702 C2 | 8/1995 |
| EP | 0 638 994 A1 | 2/1995 |

OTHER PUBLICATIONS

Peter B. Kennington: "Linearised RF Amplifier and Transmitter Techniques", Wireless Systems International Ltd., 1998, pp. 10–11.
V. Petrovic et al.: "Polar–Loop Transmitter", School of Electrical Engineering, Mar. 1979;.

* cited by examiner

Primary Examiner—Nick Corsaro
Assistant Examiner—Edan Orgad
(74) Attorney, Agent, or Firm—Laurence A. Greenberg; Werner H. Stemer; Gregory L. Mayback

(57) ABSTRACT

A polar loop transmission circuit is proposed wherein a signal to be transmitted and a feedback signal are separated into their polar phase and amplitude components and the components are compared to one another for realizing a phase and amplitude modulation. An amplitude modulator controlled by an amplitude modulation signal is provided, whereby the amplitude modulator follows an oscillator and is preferably fashioned as a nonlinear amplifier that is operated in saturation. An amplifier attenuating the output signal of the amplitude modulator is provided in the feedback path. The present transmission architecture is suitable for future mobile radio telephone systems having a phase and amplitude modulation and are based on the known GSM standard, for example.

11 Claims, 1 Drawing Sheet

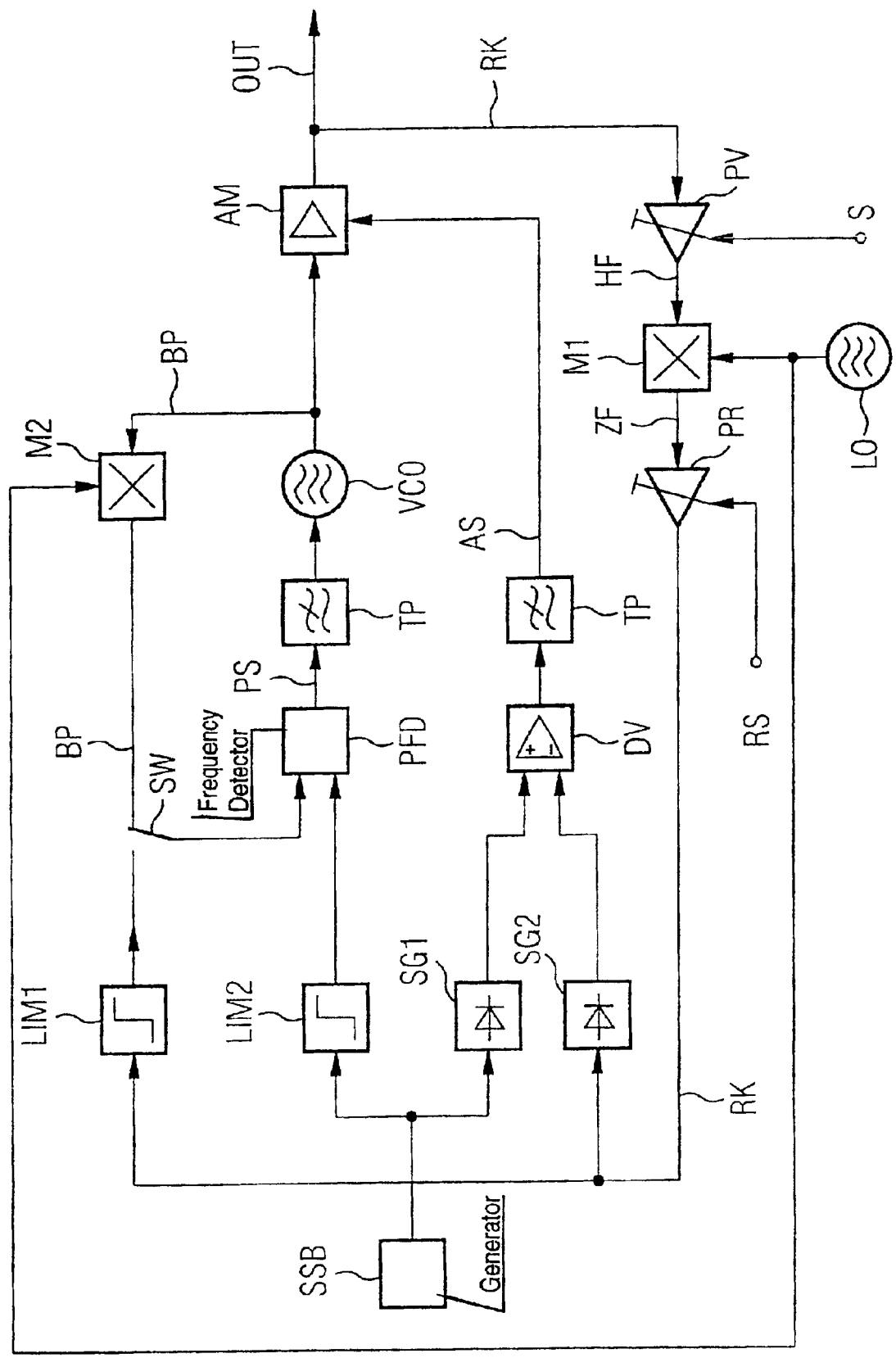

POLAR LOOP TRANSMISSION CIRCUIT

BACKGROUND OF THE INVENTION

FIELD OF THE INVENTION

The global system for mobile communications (GSM) standard is by far the most successful mobile radio telephone standard. A time-division multiplex access (TDMA) method is used as a multi-user access method by which a number of users can simultaneously communicate with a base station. What is referred to as Gaussian minimum shift keying (GMSK), which belongs to the family of the continuous phase modulation methods, is used as a modulation method on the radio channel. GMSK is particularly characterized in that its modulated signals exhibit a constant envelope, so that simple, nonlinear amplifiers can be used at the transmission end.

In addition to the phase modulation used for GSM, an amplitude modulation is to be used in the radio channel in order to take into account the bandwidth need in the mobile radio telephone service which increased as a result of internet applications, for example. Information to be transmitted, then, is not only encoded in the signal phase but also in the signal amplitude. Then, the envelope of the modulation signal is no longer constant. Linear transmission concepts are necessary for such a phase-accurate and amplitude-accurate signal transmission.

Given mobile radio telephone circuits, a low energy need or, respectively, high efficiency of the circuit components is important in addition to financial aspects in order to achieve long runtimes of the devices given small and light batteries or accumulators.

One possibility of obtaining a linear transmission architecture is characterized by the use of a linear power amplifier (PA, Power Amplifier), whereby a transmission antenna can be connected to it via an insulator. Linear power amplifiers, however, have a low efficiency of approximately 25% to 35% compared to the nonlinear power amplifiers that can be used for the traditional GSM standard, whereby the nonlinear power amplifiers reach an efficiency of approximately 50%. The efficiency is indicated as a quotient from transmitted high-frequency performance and utilized d.c. power. In addition to an increased energy need, the necessary insulator at the antenna output and the complicated power regulation—with incorporation of the base band—required for this concept is disadvantageous. During the operation, even during a transmission time slot (burst), the amplifying properties of the power high-level stage or end stage are subject to modifications as a result of temperature fluctuations, fluctuations regarding the supply voltage etc. Furthermore, measuring bursts during the measuring-in of the transmitter can lead to specification violations of the allowed transmission performance.

U.S. Pat. No. 4,481,672 proposes a polar loop transmitter. An input signal, which is to be transmitted and which is provided by a generator, and a feedback output signal, which is attenuated by an attenuator and which is converted into a deeper frequency level by a mixer is respectively separated into its polar components, i.e., into amplitude and phase. A "polar resolver" having two limiters for acquiring the phase information is provided for this purpose. An oscillator is driven by a phase detector, whereby the phase positions of both signals are supplied to it. A differential amplifier is provided which compares the amplitudes of the two signals and which modulates the envelope of a high-frequency signal generated by an oscillator. A power amplifier subsequently amplifies and filters the high-frequency signal, so that a transmitted signal is available. A peak value sampling is also provided in order to avoid negative spikes. The polar loop transmitter with a feedback branch can also function as a phase-locked loop (PLL). The document does not contain any teachings regarding time-division multiplex access methods.

SUMMARY OF THE INVENTION

It is accordingly an object of the invention to provide a polar loop transmission circuit that overcomes the above-mentioned disadvantages of the prior art devices of this general type, which is suitable for mobile radio telephone systems with phase modulation and amplitude modulation and for the transmission in time slots and which also has a low energy need.

With the foregoing and other objects in view there is provided, in accordance with the invention, a polar loop transmission circuit. The transmission circuit includes a generator outputting an input signal and an oscillator having an output and generating a high-frequency signal dependent on a phase comparison signal. The high-frequency signal is available at the output. An amplitude modulator is connected to the output of the oscillator and receives the high-frequency signal. The amplitude modulator has an output and, in dependence on an amplitude modulation signal received by the amplitude modulator, outputs an output signal derived from the high-frequency signal, at the output of the amplitude modulator. A feedback path has an amplifier with an input connected to the output of the amplitude modulator and an output. The amplifier has a control terminal for receiving a control signal. The feedback path has a mixer with a mixer output and an input connected to the output of the amplifier. The mixer outputs an intermediate frequency signal derived from the output signal and is available at the mixer output. A first circuit is provided for generating the amplitude modulation signal by comparing amplitudes of the input signal and the intermediate frequency signal. The first circuit is connected downstream of the generator and upstream of the amplitude modulator. A second circuit is provided for generating the phase comparison signal by comparing phases of the input signal and the intermediate frequency signal. The second circuit is connected downstream of the generator and upstream of the oscillator.

Given the present transmission circuit, the power high-level stage referred to as amplitude modulator can be fashioned as a nonlinear amplifier which can be operated in saturation. For example, an amplifier having an efficiency of 50% can thus be utilized.

The described polar loop architecture, with its separation of the transmission signal and feedback signal into amplitude and phase, shows linear transmission properties. Input signals, which have an additional amplitude modulation in addition to a phase modulation, therefore can be transmitted via a radio channel.

An amplifier is provided in the feedback path, whereby the output signal of the transmission circuit can be supplied to the amplifier at an input and whereby the amplifier, at the output, is connected to a first mixer fashioned as a downward mixer. The amplifier is fashioned as a linear amplifier and is preferably configured such that it is suitable for attenuating the output signal. The linear amplifier enables a controlled power level adjustment of the output signal. Furthermore, the amplifier in the feedback path makes it possible to meet TDMA specifications, particularly with respect to the transmission time slots (bursts) in the modulation method 8PSK, Phase Shift Keying or other quadrature amplitude modulations (QAM), for example.

The high efficiency of the described transmission circuit, which can be particularly achieved by a nonlinear amplitude modulator, enables long airtimes or, respectively, long operating times of the circuit and makes it possible to use small batteries or accumulators given mobile applications. This is particularly advantageous in the mobile radio telephone service.

The power level adjustability with the amplifier in the feedback path reduces the outlay of the power level compensation during the production. The components following the feedback path can be configured for lower dynamics and can be constructed more simply when the linear amplifier is applied at the beginning of the feedback path. The transmission circuit is less sensitive to temperature fluctuations and fluctuations in the operating voltage and feedbacks of an antenna that can be connected to the output, so that an insulator is not necessary at the output of the amplitude modulator.

For assuring a downward compatibility with respect to the GMSK modulation methods used in the previous GSM system, it can be desirable to set up what are referred to as dual-mode mobile radio telephone devices. As a result of the described principle, only a nonlinear power amplifier is necessary in the transmitter and not a nonlinear one for GMSK and a linear one for 8 PSK, for example. Even two power amplifiers can be foregone in dual-band devices since only two nonlinear power amplifiers are required instead of two nonlinear ones and two linear high-level stages. Dual-band mobile radio telephone devices are suitable for the GSM standard in the 900 MHz band and in the 1800 MHz band, for example.

Overall, the described polar loop transmission circuit can be constructed with a small chip surface, low costs and a simple connection to a baseband component. The polar loop architecture can effect a linearization of a nonlinear high-level stage or of a nonlinear amplitude modulator regarding the transmission data, whereby the transmission data are amplified in a phase-accurate and amplitude-accurate manner.

In a further advantageous embodiment of the present invention, the amplitude modulator is a nonlinear controllable amplifier. Nonlinear amplifiers such as class C-amplifiers are clearly more efficient than linear amplifiers and therefore have a lower current consumption.

In another advantageous embodiment of the invention, the amplifier in the feedback path is a programmable amplifier (PGC, Programmable Gain Control) attenuating the output signal. The greater the signal level is at the output signal the higher the attenuation of the amplifier. Apart from fluctuations caused by the amplitude modulation, the programmable amplifier thereby provides a constant signal level at its output. The amplifier, with respect to its input signal, i.e., with respect to the output signal of the transmission circuit, is a linear amplifier attenuating a signal at its input in a linear fashion.

In a further advantageous embodiment, a control signal can be supplied to the control terminal of the amplifier in the feedback branch. The output power level of the entire configuration can be controlled on the basis of the control signal. Therefore, the control signal is a set amplification signal. Since the amplifier is disposed in the branch of a negative feedback, the output level at the output of the amplitude modulation is greater the lower the amplification of the programmable amplifier.

In a further preferred embodiment of the invention, the circuitry for providing the phase comparison signal includes a phase and frequency detector followed by a low-pass filter and a first limiter to which the intermediate frequency signal can be supplied and a second limiter to which the input signal can be supplied, whereby the limiters, at the output side, can be connected to an input of the phase and frequency detector respectively. The input of the first limiter can be coupled with the output of the first mixer. The input of the second limiter can be connected to the generator. The generator can be fashioned as a single sideband generator, but, generally, it can also be fashioned as a modulation generator. The output of the first limiter, via a switch for example, can be connected to an input of the phase and frequency detector. The output of the second limiter can be connected to a further input of the phase and frequency detector. The output of the phase and frequency detector can be connected to the input of a low-pass filter. The output of the low-pass filter can be connected to an input of the oscillator. The oscillator can be a voltage-controlled oscillator.

The phase and frequency detector can be configured for forming a difference of a set phase and an actual phase, namely for forming a difference of the phase positions of the input signal and intermediate frequency signal.

In another preferred embodiment of the present invention, a bypass branch having a second mixer is provided which is connected to the output of the oscillator and which provides a further intermediate frequency signal at its output, which, at an input, can be supplied to the phase and frequency detector as a set signal. The described transmission circuit is suitable for the transmission in time slots (bursts). A useable output signal, however, is not available until the beginning of a transmission time slot, so that a feedback signal cannot be consulted either in the phase and frequency detector for the transient effect of the control loop. The bypass branch can be used for this purpose, which is active prior to the beginning of a transmission time slot and which, with the second mixer, converts a signal that is derivable at the oscillator VCO into an intermediate frequency signal, which, via a switch for example, can be supplied to the phase and frequency detector at an input. The second mixer can be connected to the same local oscillator, whereby the first mixer can also be connected to it.

Since a control loop is closed by the bypass branch already before the transmission has been started, a locking of the overall configuration, which can be function as a phase-locked loop (PLL), can already occur prior to the transmission start.

In a further preferred embodiment of the invention, a switch is provided which, dependent on its switch position, either connects the output of the first limiter to an input of, the phase and frequency detector or connects the output of the second mixer to the input of the phase and frequency detector.

In another preferred embodiment of the present invention, the circuit for providing the amplitude modulation signal has a difference amplifier which has a plus-input and a minus-input and which is followed by a low-pass filter, whereby the rectified input signal can be supplied to the plus-input and the rectified intermediate frequency signal to the minus-input.

For rectifying the input signal and the intermediate frequency signal, a rectifier can be respectively provided, whereby a first rectifier, at the input side, can be connected to the generator and, at the output side, can be connected to an input of the difference amplifier, and a second one, at the input side, can be connected to the feedback path and, at the output side, can be connected to a further input of the difference amplifier. A low-pass filter, which can be connected at its output to the control input of the amplitude modulator, can be connected to an output of the difference amplifier.

In a preferred embodiment of the invention, a diode rectifier is respectively provided for rectifying the input signal and the intermediate frequency signal. It is particularly simple to implement diode rectifiers.

In a further advantageous embodiment of the present invention, a synchronous rectifier can be respectively provided for rectifying the input signal and the intermediate frequency signal. For acquiring the signal envelope, the synchronous rectifiers, additionally via auxiliary inputs, can be connected to the corresponding limited signal, to the outputs of the limiters, for example.

In another preferred embodiment of the present invention, a ramping amplifier fashioned as a linear, controllable amplifier is provided. It serves the purpose of adjusting the performance of the output signal at the beginning and the end of transmission time slots. The ramping amplifier, with its input, is preferably connected to the output of the first mixer.

Other features which are considered as characteristic for the invention are set forth in the appended claims.

Although the invention is illustrated and described herein as embodied in a polar loop transmission circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The single FIGURE of the drawing is a block diagram of a first exemplary embodiment according to the invention.

DESCRIPTION OF THE PREFERRED EMBODIMENTS

Referring now to the single FIGURE of the drawing, there is shown a polar loop transmission circuit with a generator SSB providing a signal at its output that is fashioned as a single sideband signal. For separating an input signal into polar coordinates, an output of the generator SSB is connected to respectively one input of a limiter LIM2 and of a diode rectifier SG1. The limiter LIM2 provides a piece of phase information of the input signal at its output, while the amplitude of the input signal can be derived at the output of the diode rectifier SG1. The set phase information provided by the limiter LIM2, to a phase and frequency detector PFD, is compared to actual phase information provided by a limiter LIM1 by subtraction of the phase positions. Logically, the phase and frequency detector PFD provides a phase comparison signal PS at its output. An input of the limiter LIM1 is thereby connected to a feedback path RK. A low-pass filter TP having a voltage-controlled oscillator VCO connected to its output is connected to an output of the phase and frequency detector PFD. An amplitude modulator AM, which is fashioned as a power amplifier and which is an amplifier operated in saturation, is connected, with its input, to the output of the voltage-controlled oscillator VCO. The amplitude modulator AM has a control input to which an amplitude modulation signal AS can be supplied. A difference amplifier DV having a low-pass filter TP connected to its output provides the amplitude modulation signal AS, whereby the output of the low-pass filter TP is connected to the control input of the amplitude modulator AM. The difference amplifier DV has a non-inverting input, whereby the first diode rectifier SG1 is connected to it, and has an inverting input having a second diode rectifier SG2 connected to it. The input of the first diode rectifier SG1 is connected to the generator SSB; the first diode rectifier SG1, therefore, provides the amplitude information of the input signal as a set value at its output. The input of the second diode rectifier SG2 is connected to the feedback path RK and provides the amplitude information or, respectively, the envelope of a signal derived from the output signal as an actual value at its output. The feedback path RK starts at the output of the amplitude modulator AM which is connected to an input of a programmable amplifier PV. The programmable amplifier PV has a control terminal S. The output of the programmable amplifier PV is connected to a first input of a first mixer M1. A local oscillator LO is connected to a further input of the first mixer M1. The first mixer M1 provides an intermediate frequency signal ZF at its output, whereby the intermediate frequency signal ZF has a carrier frequency that can be derived from subtracting the carrier frequency from a high-frequency signal HF and a local oscillator signal.

A ramping amplifier PR, whose output is connected to the input of the limiter LIM1 and to the input of the diode rectifier SG2, is connected to the output of the first mixer M1 with its input. The ramping amplifier PR has a terminal for supplying a ramping signal RS.

The local oscillator LO is also connected to an input of a second mixer M2, which sets back the output signal of the voltage-controlled oscillator VCO into a further intermediate frequency signal. For this purpose, a further input of the second mixer M2 is connected to the output of the voltage-controlled oscillator VCO. The second mixer M2, with its output, is connected to a switch SW, which can connect through the output signal of the second mixer M2 onto an input of the phase and frequency detector PFD.

For example, a transmitting antenna can be connected to the high-frequency output OUT. The output signal provided at the high-frequency output OUT thereby is the input signal which is amplified in a phase-accurate and amplitude-accurate fashion and which is provided at the output of the generator SSB.

The output signal provided at the high-frequency output OUT of the transmission circuit is attenuated with the programmable amplifier PV in the feedback path. Therefore, a high-frequency signal HF having a defined power level is pending at its output, whereby the power level is constant apart from fluctuations that are caused by the amplitude modulation. The power level at the output OUT can be controlled at the control terminal S on the basis of a control signal. The programmable amplifier PV is a linear amplifier that linearity attenuates the signal that can be supplied to its input. On the other hand, the voltage of the high-frequency signal HF provided at its output, nonlinear, is dependent on an adjustment signal that can be supplied to the control terminal S and is 2 dB per least-significant bit change of the adjustment signal in the present example. On the basis of a local oscillator signal that can be generated by the local oscillator LO, the first mixer M1 transforms the high-frequency signal HF back into an intermediate frequency signal. The power ramping amplifier PR, which can have the intermediate frequency signal ZF supplied to its input, effects a controlled upward adjustment of the performance of the output signal at the output OUT at the beginning of a transmission time slot (burst) and correspondingly effects a controlled downward adjustment of the output power at the output OUT at the end of transmission time slots. The ramping amplifier PR has a control input for this purpose, whereby a ramping signal RS controlling an amplification factor or attenuation factor of the ramping amplifier PR can be supplied to it.

A locking of the phase-locked loop already before the beginning of the transmission time slot is effected by activating the bypass path BP with the switch SW, so that the switch SW is switched at the beginning of the transmission time slot such that the output of the limiter LIM1 is connected to an input of the phase and frequency detector PFD, the ramp-shaped upward adjustment of the output power of the transmission circuit does not start prior to this.

It is possible to operate the circuit with less energy demand, since the power amplifier, which is fashioned as an amplitude modulator AM here, is operated in saturation and since the required linearity of the overall configuration, however, is achieved by the feedback path RK in a polar loop transmission architecture.

The circuit features with the ramping amplifier PR and the bypass path BP allow a controlled adjustment of the power level at the output OUT and therefore make it possible to meet specification limiting values that are typically provided with respect to TDMA systems.

Since the amplitude modulator AM is fashioned as a nonlinear, controllable power amplifier, it is highly efficient, i.e., the quotient from the output power and used d.c. power is relatively large and is at 50% in the described example.

In the present transmission circuit, an insulator is not necessary at the output OUT.

The generator SSB can also be fashioned as a generator providing a modulated signal at its output.

Since the programmable amplifier PV is disposed at the beginning of the feedback path RK, the following stages in the feedback path can be configured for lower dynamics, however, they should be sufficient for high linearity requirements.

The described control concept compensates temperature fluctuations and operating voltage fluctuations. The complicated power level compensation, which normally arises during the production of the device, and therefore the outlay associated with it can also be clearly reduced.

The described amplitude modulator AM, which is fashioned as a nonlinear amplifier and which sometimes is also referred to as power amplifier, at the same time, can serve as a power amplifier in a traditional GMSK modulation method used for the established GSM standard, so that two power amplifiers, namely a nonlinear one and a linear one, are no longer necessary in future dual-mode devices but only one power amplifier, namely a nonlinear one. This is associated with less outlay, considerable cost savings and savings regarding the chip surface or, respectively, printed circuit board space.

The described transmission architecture is particularly suitable for the application in future mobile radio telephone systems which are based on modulation methods that also have an amplitude modulation in addition to a phase modulation.

We claim:

1. A polar loop transmission circuit, comprising:
   a generator outputting an input signal;
   an oscillator having an output and generating a high-frequency signal dependent on a phase comparison signal, the high-frequency signal being available at said output;
   an amplitude modulator connected to said output of said oscillator and receiving the high-frequency signal, said amplitude modulator having an output and, in dependence on an amplitude modulation signal received by said amplitude modulator, outputs an output signal derived from the high-frequency signal, at said output of said amplitude modulator;
   a feedback path having an amplifier with an input connected to said output of the amplitude modulator and an output, said amplifier having a control terminal for receiving a control signal, said feedback path having a mixer with a mixer output and an input connected to said output of said amplifier, said mixer outputting an intermediate frequency signal derived from the output signal and available at said mixer output;
   first circuitry for providing the amplitude modulation signal by comparing amplitudes of the input signal and the intermediate frequency signal, said first circuitry connected downstream of said generator and upstream of said amplitude modulator; and
   second circuitry for providing the phase comparison signal by comparing phases of the input signal and the intermediate frequency signal, said second circuitry connected downstream of said generator and upstream of said oscillator.

2. The polar loop transmission circuit according to claim 1, wherein said amplitude modulator is a nonlinear, controllable amplifier.

3. The polar loop transmission circuit according to claim 1, wherein said amplifier is a programmable amplifier attenuating the output signal.

4. The polar loop transmission circuit according to claim 1, wherein the control signal received by said amplifier controls a performance of the output signal.

5. The polar loop transmission circuit according to claim 1, wherein said second circuitry for providing the phase comparison signal includes a phase and frequency detector having inputs, a low-pass filter connected downstream of said phase and frequency detector, and a first limiter connected to said feedback path and receiving the intermediate frequency signal, a second limiter connected to and receiving the input signal from said generator, said first and said second limiter each having an output connected to one of said inputs of said phase and frequency detector.

6. The polar loop transmission circuit according to claim 5, including a bypass branch containing a further mixer having an output and an input connected to said output of said oscillator, said further mixer outputting a further intermediate frequency signal at said output and said output of said further mixer connected to one of said inputs of said phase and frequency detector.

7. The polar loop transmission circuit according to claim 6, including a switch connecting said output of said further mixer to one of said inputs of said phase and frequency detector in an adjustment operation, said switch further connects said output of said first limiter to one of said inputs of said phase and frequency detector in a transmission operation.

8. The polar loop transmission circuit according to claim 1, wherein said first circuitry for providing the amplitude modulation signal includes a difference amplifier having a plus-input and a minus-input, a low-pass filter connected downstream from said difference amplifier and upstream from said amplitude modulator, said plus-input provided for receiving a rectified input signal and said minus-input provided for receiving a rectified intermediate frequency signal.

9. The polar loop transmission circuit according to claim 8, containing diode rectifiers including a first diode rectifier connected between said generator and said difference amplifier and a second diode rectifier connected between said feedback path and said difference amplifier, said first diode rectifier receiving and rectifying the input signal and outputting the rectified input signal, said second diode rectifier receiving and rectifying the intermediate frequency signal and outputting the rectified intermediate frequency signal.

10. The polar loop transmission circuit according to claim 8, including synchronous rectifiers each having an output coupled with one of said minus-input and said plus-input of said difference amplifier.

11. The polar loop transmission circuit according to claim 1, wherein said feedback paths includes a ramping amplifier connected to said output of said mixer, said ramping amplifier is a linear, controllable amplifier for adjusting the performance of the output signal at a beginning and at an end of transmission time slots.

* * * * *